US006229317B1

(12) United States Patent
Barchuk

(10) Patent No.: US 6,229,317 B1
(45) Date of Patent: May 8, 2001

(54) SENSOR FOR EVALUATING DIELECTRIC PROPERTIES OF SPECIALIZED PAPER

(75) Inventor: Vladymir Barchuk, Kiev (UA)

(73) Assignee: CashCode Company Inc., Concord (CA)

( * ) Notice: Subject to any disclaimer, the term of this patent is extended or adjusted under 35 U.S.C. 154(b) by 0 days.

(21) Appl. No.: 09/263,516

(22) Filed: Mar. 5, 1999

(51) Int. Cl.[7] ........................ G01R 27/28; G01R 27/26

(52) U.S. Cl. ........................ 324/663; 324/661; 324/658; 324/674

(58) Field of Search ........................ 324/661, 669, 324/663, 667, 658, 686, 695, 701, 674

(56) References Cited

U.S. PATENT DOCUMENTS 4,355,300 * 10/1982 Weber ........................ 340/146
5,122,754 6/1992 Gotaas .
5,308,992 * 5/1994 Crane et al. ........................ 250/556
5,309,110 * 5/1994 O'Neill et al. ........................ 324/674
5,510,779 * 4/1996 Maltby et al. ........................ 340/870.3

FOREIGN PATENT DOCUMENTS 42 32 185 3/1994 (DE) .
0 097 570 1/1984 (EP) .

* cited by examiner

*Primary Examiner*—Safet Metjahic
*Assistant Examiner*—Anjan K Deb

(57) ABSTRACT

A capacitor sensor for assessing dielectric properties of currency paper uses a transmitting dielectrode on a first side of an evaluation channel and a receiving electrode on the same first side of the evaluation channel. A passive electrode is located on the opposite side of the evaluation channel and overlays with the transmitting and receiving electrodes. An electronic processing arrangement is connected to the transmitting and receiving electrodes and evaluates the signals for changes in the capacitance coupling of the electrode. This coupling is directly related to the properties of the paper passing between the passive electrode on one side and then transmitting and receiving electrodes on the other side.

14 Claims, 2 Drawing Sheets

SENSOR FOR EVALUATING DIELECTRIC PROPERTIES OF SPECIALIZED PAPER

FIELD OF THE INVENTION

The present invention relates to validators having sensors for evaluating dielectric properties of specialized papers. The invention has particular application for paper currency evaluation and security appear evaluation.

BACKGROUND OF THE INVENTION

Currency validators are designed to receive a banknote and move the banknote through an evaluator channel prior to accepting and storing of the accepted banknote. From time to time a banknote can become jammed in the validator which creates problems, particularly for unsupervised installations.

Jamming of a validator often is due to a wet or high humidity banknote or due to high density paper sometimes found in fraudulent banknotes. These conditions can be recognized by a capacitor sensor.

When the currency bill passes between capacitor electrodes, the capacitor capacitance increases according to the effect of the dielectric properties of the currency note. The deviations from this value will be observed when the samples with higher or lower density are tested in the validator.

Water has a dielectric constant almost ten times higher than the dielectric constant of currency paper. When we, currency paper passes between the capacitor plates, its capacitance is higher than dry paper, the wetter the paper, the larger the capacitance (as compared to the authentic currency paper). Therefore, the capacitive sensor can determine the "humidity" of currency paper and can be used to evaluate the authenticity of the paper, as the currency paper is being evaluated by the validator.

Many validators are used in a generally non-supervised application such as a vending machine. Fraudulent bills often have a high density and if fully processed by a validator, can become jammed or damage the validator.

It is important in validators to reject fraudulent bills, however, it is also important to reject bills which may become jammed in the validator or which may damage the validator. A jammed validator causes the operator problems and also frustrates the user.

Information about the humidity and other parameters of the paper, evaluated by a validator, are important for the validator's operation.

The design of automatic validators makes contradictory demands. The size of the sensor should be small. It should be designed in such a way that it can be placed anywhere inside the validator channel. Rigid mechanical and electrical connections between the sensor elements placed on the opposite sides of the validator channel lead to complex configurations. The measurement results should not significantly vary with wobble of the paper in the validator channel. It is also desirable for the validator to reject bills which are likely to become jammed in the validator.

SUMMARY OF THE INVENTION

The present invention is directed to an arrangement for sensing the dielectric properties of a paper substrate as the paper substrate moves through an evaluation channel.

The arrangement includes a generating electrode on a first side of the channel; a receiving electrode located on the first side of the channel and spaced from the generating electrode; a passive conducting electrode situated on a second side of the channel opposite the first side and overlapping with the generating electrode and the receiving electrode; and a electronic processing arrangement connected to the generating electrode and the receiving electrode which evaluates the signals thereof for changes in the detected capacitance sensed by coupling of the electrodes via the passive conducting electrode.

According to an aspect of the invention, the arrangement further includes a screening electrode located on the first side of the channel and connected to the electronic processing arrangement in a manner to diminish capacitance due to direct coupling of the generating electrode and the receiving electrode.

According to a further aspect of the invention, the generating electrode is provided with an alternating voltage high frequency signal.

According to yet a further aspect of the invention, the passive conducting electrode has no electrical connection with the electronic processing arrangement.

According to yet a further aspect of the invention, the processing arrangement converts any high frequency signal received by the receiving electrode into a d.c. voltage which provides a measure of the capacitive coupling of the generating and receiving electrodes which is greatly changed in accordance with the banknote currency.

According to yet a further aspect of the invention, the electronic processing arrangement uses the d.c. voltage to assess the humidity of a substrate located in the evaluation channel.

The electronic processing arrangement in a preferred aspect of the invention uses a measurement of capacitance for determining the humidity of the substrate and rejects the substrate when the determined humidity is grater than a predetermined level. It also rejects dry fraudulent bills with deviations of the dielectric properties relative to known dielectric properties of authentic bills.

BRIEF DESCRIPTION OF THE DRAWINGS

Preferred embodiments of the invention are shown in the drawings, wherein.

DETAILED DESCRIPTION OF THE PREFERRED EMBODIMENTS

Currency or banknote validators move a banknote along a particular path and assuming the banknote is accepted, typically store the banknote in a stacking arrangement. The pathway through the validator has a number of sensors placed there along for evaluating the banknotes as it passes the sensor. Various drive wheels advance the banknote from the entrance to the validator to the banknote stacking arrangement. An example of such a validator is shown in our U.S. Pat. No. 5,657,846.

Figure 1:
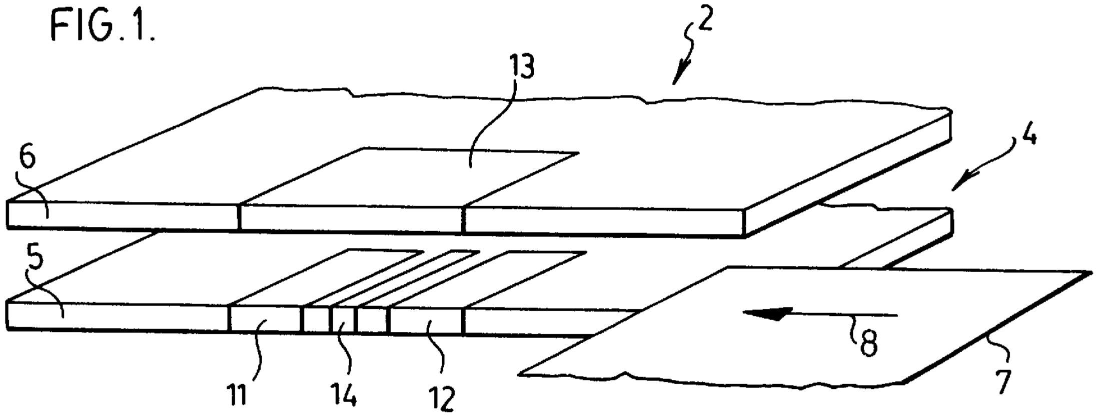
FIG. 1 is a perspective view of the sensor electrode system, located in a validator evaluation channel.

A capacitive sensor 2, is shown in FIG. 1 and is located in the channel 4 through which the banknote 7 is passed for evaluation in the direction of arrow 8. The channel 4 includes opposed channel walls 5 and 6 which are made of a plastic or similar dielectric isolating material. The channel walls 5 and 6 include slots therein for receiving the generator electrode 11 and the receiving electrode 12 as well as the screening electrode 14 in the channel wall 5. Directly opposite these electrodes is a large flat passive electrode 13 located in a slot in the channel wall 6. This flat passive electrode 13 is situated directly over and is parallel to the generator electrode 11 and the receiving electrode 12.

The passive electrode 13 is sized and placed within the channel walls 6 such that the projection of electrode 13 on the wall 5 of the channel covers both the generator electrode 11 and the receiving electrode 12. The purpose of the passive electrode is to couple the electrodes in a manner to be directly influenced by the change in capacitance caused by the dielectric properties of the banknote 7 passing between the electrodes.

The screening electrode 14 serves to reduce the direct coupling between the generating electrode 11 and receiving electrode 12.

As the banknote 7 is transported along the channel 4, it is located between the electrodes, and thus significantly effects the magnitude of the capacitive coupling of the electrodes. Generally, the banknote is parallel to electrodes 11, 12 and 13, however, it may be nonparallel because of some wobble on the banknote. The exact position of the banknote between the electrodes is not critical as the net is tolerable because capacitance is mainly dependent on the presence of the banknote between the electrodes and the exact location of the banknote between the electrodes is not as significant.

It can be appreciated the sensing arrangement of FIG. 1 is quite compact and rugged and there is no requirement to electrically hard wire the passive electrode 13 to the processing circuitry. This simplifies the electrical connection of the capacitance sensor as validators typically open by splitting along the pathway 4 for servicing of sensors and removing any banknote which may have become jammed. With a spilt validator, the components on one side of the pathway remain stationary and components on the opposite side of the pathway move when the validator is opened. In this case, the channel wall 5 can be located in the stationary part of the validator and thus, its electrical connection to the processing circuitry is simple and straightforward, and does not have to accommodate movement for service. The passive electrode 13 is located in the moving part of the housing.

Figure 2:
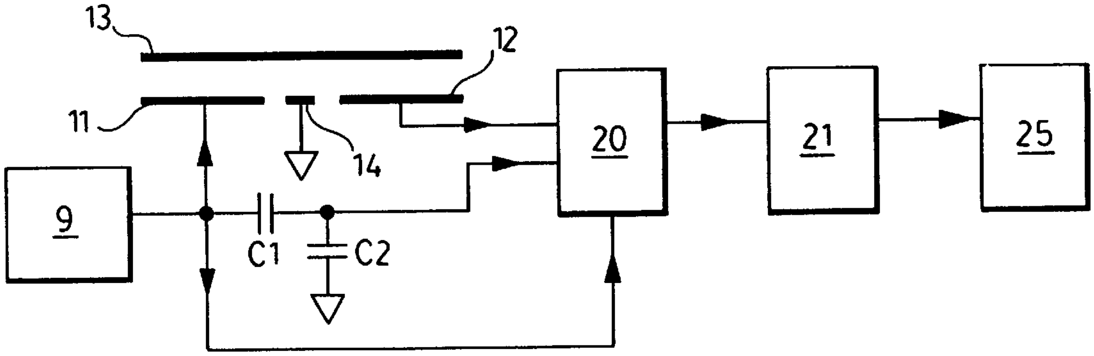
FIG. 2 is the block schematic of the sensing arrangement.

In FIG. 2, a high frequency generator 9 is connected with the generating electrode 11; the feed of the high frequency generator is also provided to the locking detector 10 and is used as a reference signal. The receiving electrode 12 is connected with one of the differential inputs of the locking detector 10. Another differential input of the locking detector 10 is supplied with the compensating high frequency signal formed by the capacitance divider C1-C2.

The screening electrode 14 is connected with the ground of the system. The signal formed by the locking detector 10 is amplified by amplifier 11 and is subsequently converted to a digital signal which may be analyzed by the program of the central processing unit 25. At certain levels of the signal, the banknote is rejected as having too high a moisture level, otherwise the signal is compared to the appropriate standard of authentic currency.

Figure 3:
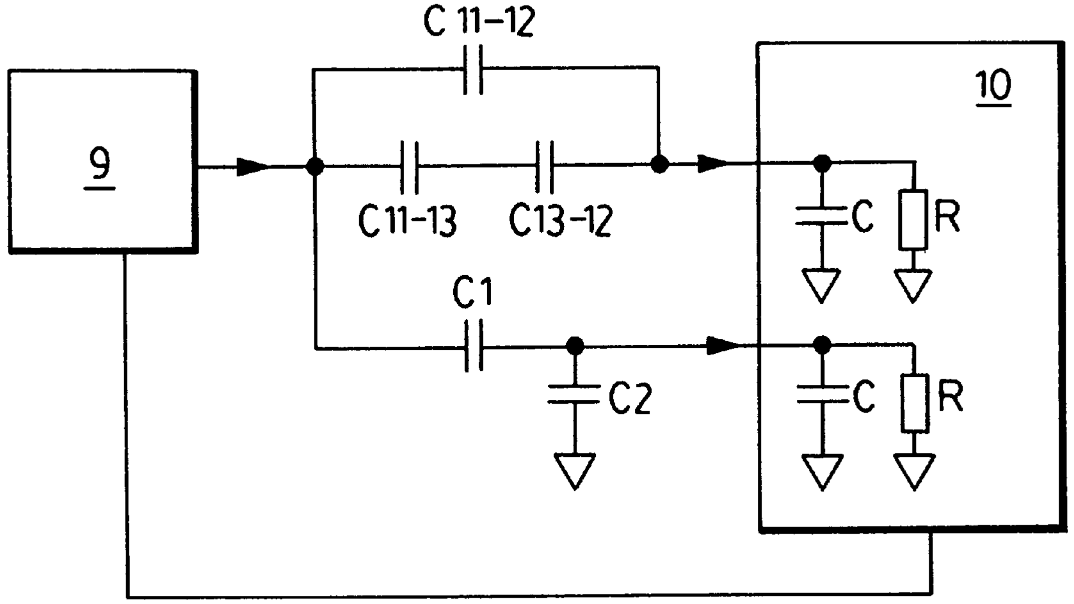
FIG. 3 is a schematic of the arrangement for processing the signals of the sensing arrangement.

FIG. 3 shows a schematic of the capacitance of the various electrodes of the sensor and the elements of the electronic processing arrangement that are directly associated with the electrodes. C11-12 is the capacitance between the generating electrode 11 and passive electrode 12; C13-12 is the capacitance between the passive electrode 13 and receiving electrode 12. As evident from FIG. 1, these capacitance are the ones of plane capacitors. C11-12 is negligibly small in the case of installed screening electrode 14. FIG. 3 also illustrates capacity divider C1, C2 for the signal of the high frequency generator 9, input capacitance C and input active resistances R of the inputs of the lock-in detector 10. It can be seen that the capacitors form a capacitance bridge with generator 9; the outputs of the bridge are connected to the inputs of the lock-in detector 10. The bridge may be balanced by adjusting capacitance divider C1, C2.

When the bridge is unbalanced, a d.c. voltage is produced at the output of the lock-in-detector 10. The resulting voltage is a direct function of the unbalanced state of the bridge.

Since the sensor has small plate sizes, the interelectrode capacitances are small, generally not exceeding 10 pF. The input capacitances of the lock-in detector are of the same order of magnitude. To achieve a useful sensitivity, a high generating frequency is used. It has been determined that the preferred frequency range is between 50–150 MHz. At these frequencies, the impedances of the bridge capacitances are smaller than the input active resistances R of lock-in detector and, therefore, the input resistances only marginally effect the phase and amplitude characteristics of the bridge.

It should be noted that the elements C1 and C2 can be excluded from the circuit if their absence does not saturate lock-in detector 10. In their absence, the system can be balanced by varying the input voltage shift of d.c. amplifier 11. when the currency paper moves between the electrodes of the sensor, the capacitances of C11-13 and C13-12 increase and unbalance the capacitance bridge. As the currency paper is situated in practically the constant field of the capacitors C11-13 and C13-12, the magnitude of the disbalance signal is isolated from effects of wobble the paper in the validator channel and essentially depends on the dielectric properties of the currency paper. Thus by measuring the magnitude of the unbalanced signal, the system determines the authenticity of the dielectric properties of the currency paper.

Wet currency paper fed to the validator may jam the transport mechanism. Therefore, it is important to evaluate the moisture content of the currency paper as early as possible. The dielectric constant of water is approximately 10 times larger than the dielectric constant of dry currency paper. As such, currency paper having high humidity provides high capacitance and produces a large signal in the sensor. Thus, the magnitude of the output signals gives information about the humidity of the currency paper. If the measured signal is too high, the banknote is rejected.

It should be understood by those skilled in the art, that modifications may be made without departing from the spirit and scope of the invention as defined in the claims. Accordingly, reference should be made primarily to the accompanying claims, rather than the foregoing specification, to determine the scope of the invention.

What is claimed:

1. A system for sensing dielectric properties of currency paper, said system comprising:

a) a high frequency generator connected to a generating electrode;

b) a receiving conducting electrode situated a spaced distance from the generator electrode in generally the same plane thereof;

c) a passive conducting electrode situated in a plane, parallel to the plane of the generating electrode and receiving electrode, and in a fixed position relative to said receiving electrode and said generator electrode, and defining a currency evaluation channel with said passive conducting electrode on one side of said channel, and said generating and receiving electrodes on an opposite side of said channel, passive conducting electrode having no electrical interconnections with electronic scheme of the system; and d) a signal processing arrangement connected with the generating and the receiving electrode and converting the high frequency signal on the receiving electrode with reference to the high frequency generating electrode into a d.c. voltage that characterizes the magnitude of capacitance coupling between the generator and receiving electrodes, the magnitude of the d.c. voltage being dependent on the humidity and dielectric properties of the currency paper placed in the space between the electrodes.

2. The system of claim 1, further comprising a screening electrode, situated between the generating electrode and receiving electrode connected to the signal processing arrangement, said screening electrode diminishing the direct capacitance between generating and receiving electrodes.

3. The system of claim 1, wherein a lock-in detector is used for converting of high frequency voltage of the receiving electrode.

4. The system of claim 1 wherein the attenuated output of the generator is applied to a differential input of said lock-in detector and is used as a compensation signal when there is no currency paper in the space between the electrodes.

5. The system of claim 1, wherein the signal processing arrangement is situated near the generator and receiving electrodes which are all situated on one side of a channel which receives the currency paper.

6. An arrangement for sensing the dielectric properties of a paper substrate as the paper substrate moves through an evaluation channel, said arrangement comprising;

a generating electrode on a first side of said channel connected to a high frequency signal source;

a receiving electrode located on said first side of said channel and spaced from said generating electrode;

a passive conducting electrode situated on a second side of said channel opposite said first side and in a fixed position relative to said receiving electrode and said generator electrode and overlapping with said generating electrode and said receiving electrode;

and a electronic processing arrangement connected to said generating electrode and said receiving electrode which evaluates the signals thereof for changes in the capacitance couplings of said electrodes via the passive conducting electrode.

7. An arrangement as claimed in claim 6 wherein said arrangement further includes a screening electrode located on said first side of said channel between said generating and receiving electrodes and connected to said electronic processing arrangement in a manner to diminish direct capacitance between said generating electrode and said receiving electrode.

8. An arrangement as claimed in claim 7 wherein said generating electrode is provided with an alternating voltage high frequency signal having a frequency in the range of 50 to 150 MHz.

9. An arrangement as claimed in claim 6 wherein said generating and said receiving electrodes are located in the same plane and said evaluation channel is made of a dielectric isolating material.

10. An arrangement as claimed in claim 9 wherein said passive electrode has no direct electrical connection with said electronic processes arrangement.

11. An arrangement as claimed in claim 9 wherein said electronic processing arrangement converts any high frequency signal received by said receiving electrode into a d.c. voltage which provides a measure of the capacitance coupling between said generating and receiving electrode via the passive electrode.

12. An arrangement as claimed in claim 11 wherein said electronic processing arrangement uses the d.c. voltage to assess the humidity of a substrate located in said evaluation channel.

13. An arrangement as claimed in claim 12 wherein said electronic processing arrangement uses a measurement of capacitance for determining the humidity of the substrate and rejecting the substrate when the determined humidity is greater than a predetermined level.

14. An arrangement as claimed in claim 6 wherein said passive electrode is at least twice the size of said generating electrode.

* * * * *